United States Patent [19]

Matsuzawa et al.

[11] 4,444,615
[45] Apr. 24, 1984

[54] METHOD FOR PRODUCING A SINGLE CRYSTAL

[75] Inventors: Soichiro Matsuzawa, Kuwana; Syunzo Mase, Aichi, both of Japan

[73] Assignee: NGK Insulators, Ltd., Japan

[21] Appl. No.: 322,757

[22] Filed: Nov. 19, 1981

[30] Foreign Application Priority Data

Nov. 28, 1980 [JP] Japan .................................. 55-166645

[51] Int. Cl.$^3$ ............................................... C30B 1/10
[52] U.S. Cl. .................................................. 156/603
[58] Field of Search ........... 156/603, DIG. 88, 616 R, 156/DIG. 61, DIG. 74

[56] References Cited

U.S. PATENT DOCUMENTS 3,585,088  6/1971  Schwuttke et al. .................. 156/603
4,046,618  9/1977  Chaudhari et al. .................. 156/603

Primary Examiner—Hiram H. Bernstein
Attorney, Agent, or Firm—Parkhurst & Oliff

[57] ABSTRACT

A single crystal is produced by previously forming a macrocrystal grain having substantially the same crystal structure as crystal grains composing a polycrystal showing a discontinuous crystal grain growth or forming said macrocrystal grain after preparing said polycrystal in contact with the crystal grains composing the polycrystal and heating such a contacted body at a temperature lower than the temperature causing the discontinuous crystal grain growth of the polycrystal to grow crystal while integrating the above described macrocrystal grain with the crystal grains composing the polycrystal whereby a single crystal is grown.

8 Claims, 7 Drawing Figures

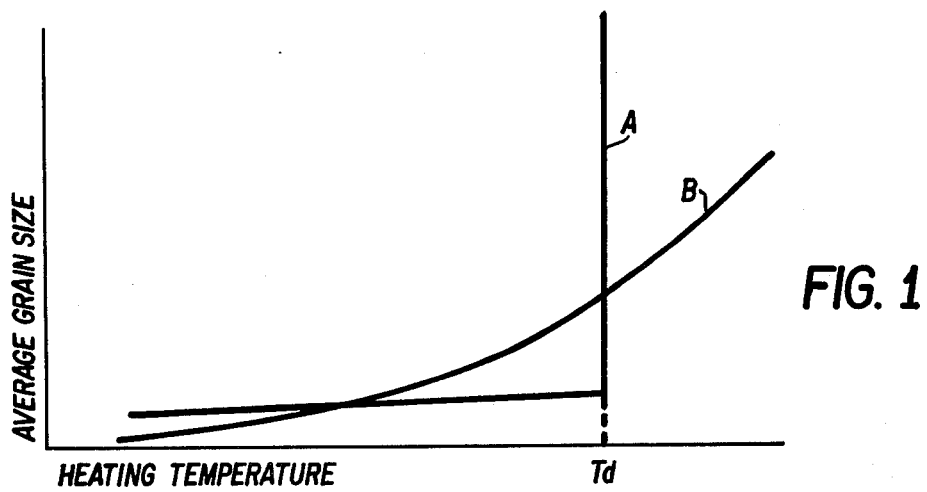
FIG. 1
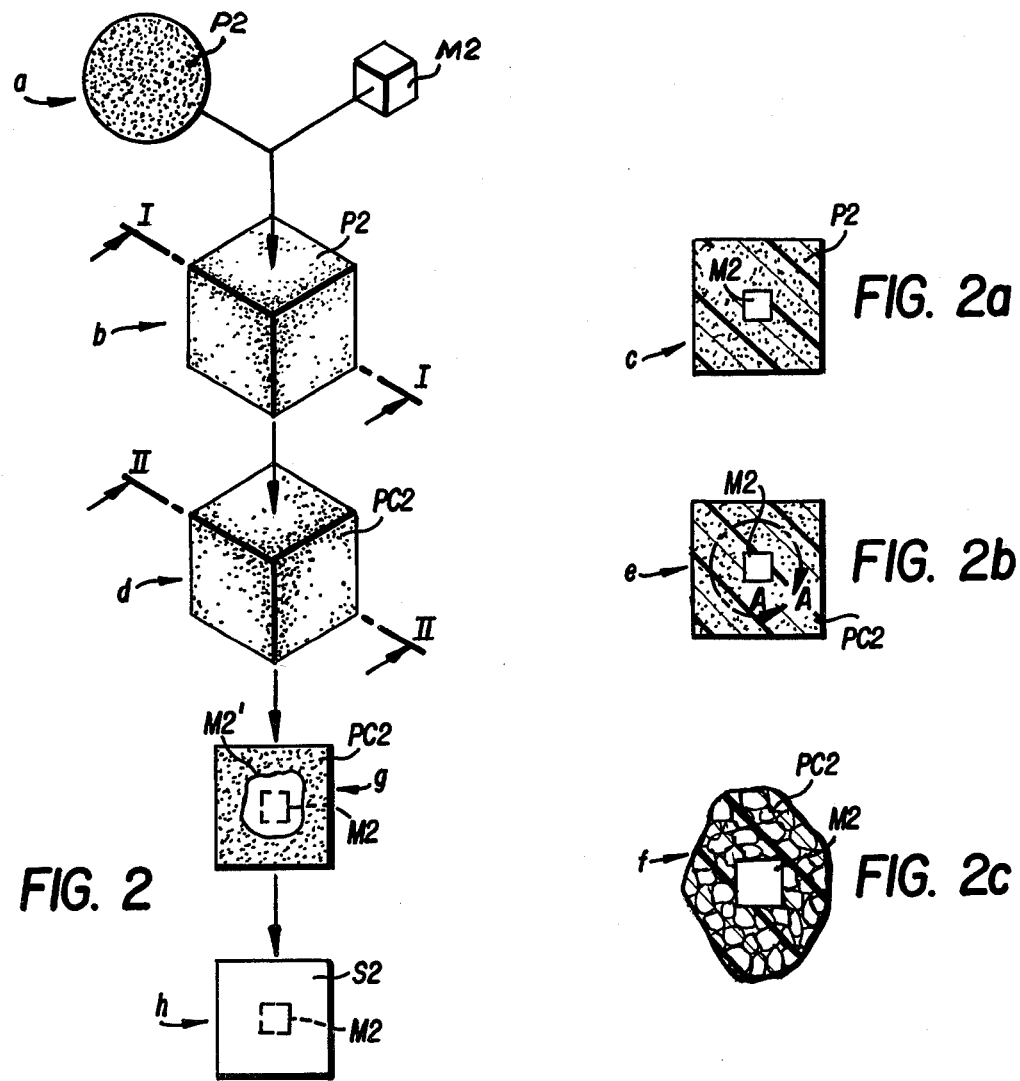
FIG. 2a
FIG. 2b
FIG. 2c
FIG. 2

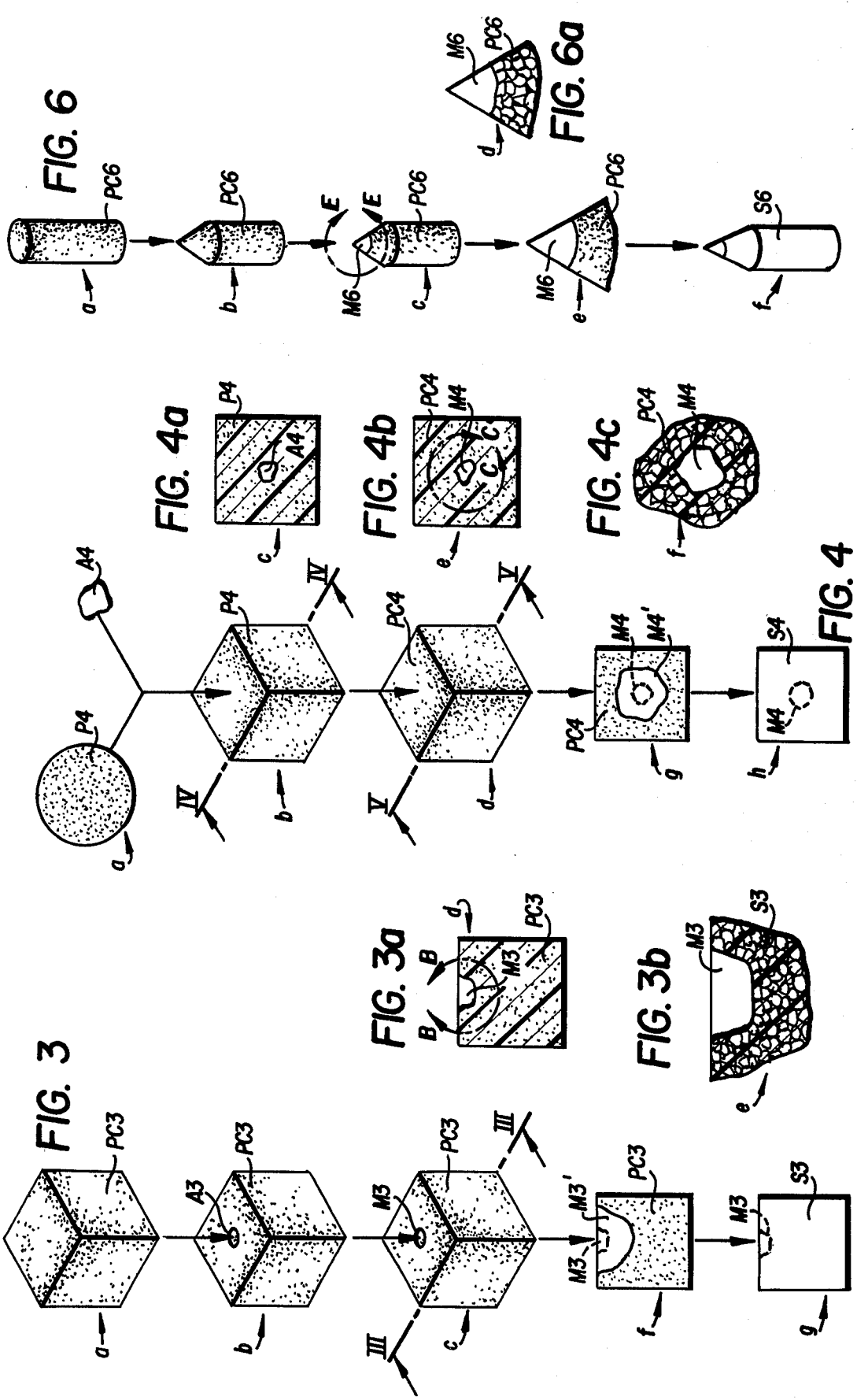

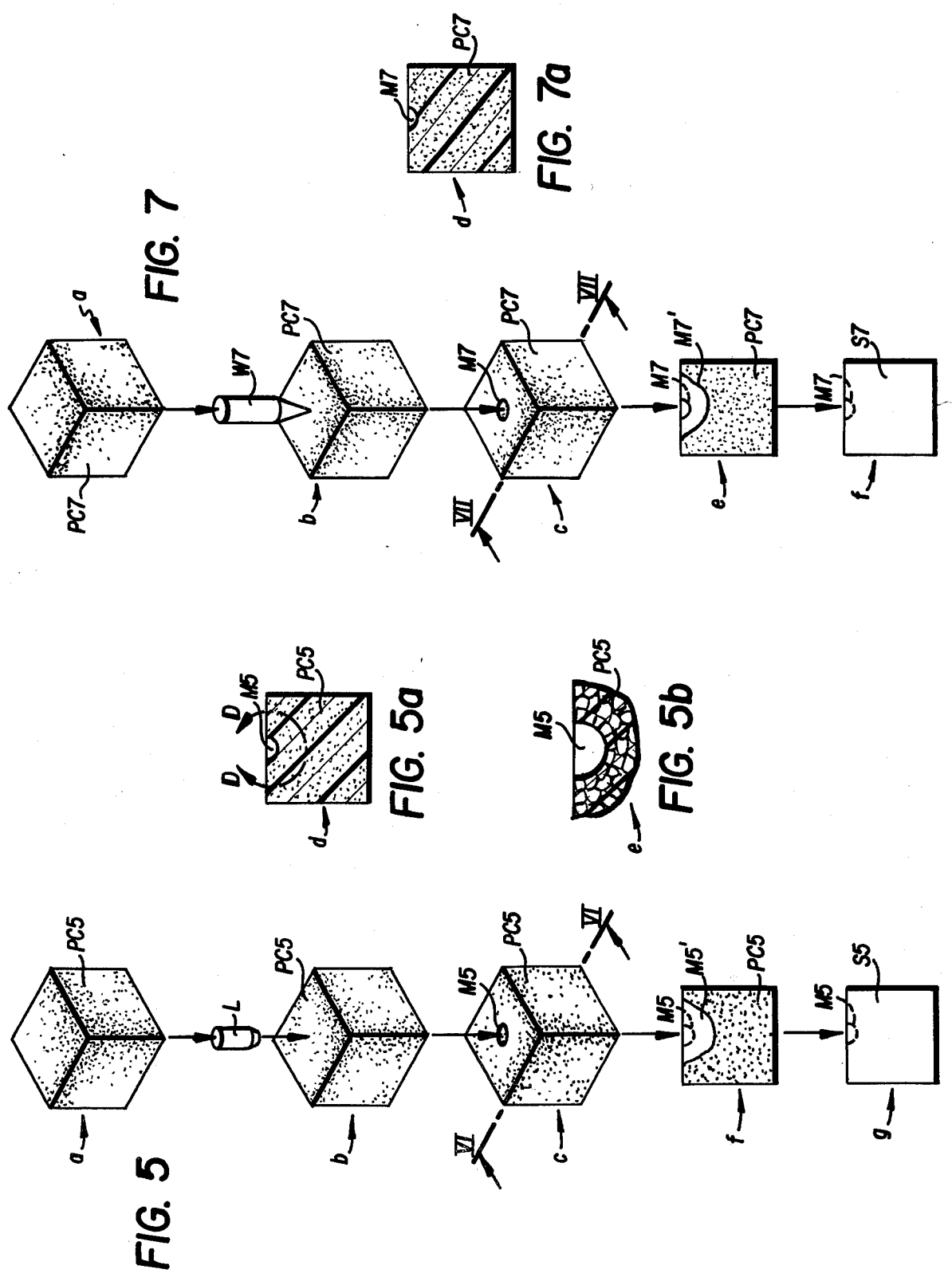

METHOD FOR PRODUCING A SINGLE CRYSTAL

BACKGROUND OF THE INVENTION

The present invention relates to a method for producing a single crystal by forming a nucleus, which is a macro-crystal grain, in a part of a polycrystal showing a discontinuous crystal grain growth and growing the nucleus through a solid phase reaction to grow a single crystal.

Heretofore, methods wherein a starting material is melted at a temperature higher than a melting point of the starting material and a single crystal is grown from the molten liquid phase, such as a pick up process, Bernoulli process, Bridgman process, floating zone melting process, flux process and the like have been broadly known.

However, any conventional method wherein a single crystal is grown from the molten liquid phase needs a high temperature, so that when a starting material containing a component having a high vapor pressure is used, the composition readily varies and impurities are readily admixed from a crucible used for melting the starting materials, so that the crystallinity of the obtained single crystal is not uniform. Furthermore, all the above described conventional methods need a large, expensive, complicated production apparatus and severe production conditions. Thus, mass production is difficult and therefore the obtained single crystal product has a high cost.

SUMMARY OF THE INVENTION

The present invention has been made for obviating these prior defects and problems and consists in a method for growing a single crystal by forming a nucleus, which is a macrocrystal grain, in a polycrystal and growing the nucleus into crystal through a solid phase reaction. The present invention further is a method for producing a single crystal which comprises first forming a macrocrystal grain having substantially the same crystal structure as crystal grains composing a polycrystal showing a discontinuous crystal grain growth at the time when a shaped body is sintered to make a polycrystal. The macrocrystal grain may also be formed after preparing said polycrystal in contact with the crystal grains composing the polycrystal. The next step is heating such a polycrystal at a temperature lower than the temperature causing the discontinuous crystal grain growth of the polycrystal to grow a macrocrystal while intergrating the above described macrocrystal grains with the crystal grains composing the polycrystal whereby a single crystal is grown.

BRIEF DESCRIPTION OF THE DRAWINGS

The above objects, features and advantages of the present invention will become more apparent from reading the following description of the preferred embodiments taken in connection with the accompanying drawings, wherein;

FIG. 1 is a graph of crystal grain growth versus temperature showing the discontinuous grain growth temperature Td;

FIG. 2 illustrates a method of producing a single crystal from a polycrystalline material by inducing growth through the introduction of a macrocrystal nucleus;

FIG. 3 illustrates a method of producing a single crystal from a polycrystalline material by introducing an additive on the surface of a polycrystal thereby inducing a macrocrystal nucleus;

FIG. 4 illustrates a method of producing a single crystal from a polycrystalline material by introducing an additive on the interior of a polycrystal thereby inducing a macrocrystal nucleus;

FIG. 5 illustrates a method of producing a single crystal by laser activating an area of a polycrystal to form a macrocrystal nucleus from which the single crystal can grow;

FIG. 6 illustrates a method of producing a single crystal by forming a pointed tip on the end of a polycrystalline cylinder and heat inducing a macrocrystalline nucleus at the tip;

FIG. 7 illustrates a method of producing a single crystal from a polycrystalline material by concurrently heating and stressing a small area on the polycrystal thereby inducing a macrocrystal nucleus.

DETAILED DESCRIPTION OF THE PREFERRED EMBODIMENTS

The present invention will be explained in more detail hereinafter.

When a polycrystal composed of microcrystal grains is heated at a temperature lower than the melting point, the crystal grains composing the polycrystal grow. This polycrystal includes a polycrystal showing a discontinuous crystal grain growth as shown in curve A of FIG. 1, in which crystal grains grow only very slightly when the heating temperature is lower than the particularly defined temperature Td° C. When the temperature becomes Td° C. or higher, a part of the crystal grains suddenly integrates the surrounding microcrystal grains and rapidly grows into macrocrystal grains. In a polycrystal showing a continuous crystal grain growth as shown in a curve B, as the heating temperature is raised, the crystal grains continuously grow to a high temperature.

The present invention is a method for producing a single crystal using the polycrystal showing the discontinuous crystal grain growth at the particularly defined temperature Td° C. as shown in the curve A among these polycrystals.

The term "discontinuous crystal grain growth" used herein means the phenomenon that nuclei which become starting points of the discontinuous crystal grain growth in the polycrystal at the particularly defined temperature, that is a crystal grain having a size which is from several times to several tens times of the size of the surrounding crystal grains, are formed. The nuclei then grow, integrating the surrounding microcrystal grains at a rapid speed. The term "temperature causing the discontinuous crystal grain growth" used herein means the temperature causing such a phenomenon. The phase where the nuclei of the discontinuous crystal grain growth of the polycrystal are formed and the phase when the nuclei grow, are entirely different, and the temperatures at which the respective phases occur are different.

That is, in a polycrystal showing the discontinuous crystal grain growth in the heating phase, the temperature at which the nuclei of the discontinuous crystal grain growth are formed is higher than the temperature at which the nuclei grow. When the nucleus which becomes the starting point of the discontinuous crystal grain growth, that is a macrocrystal grain having a size from several times to several tens times of the size of the crystal grains composing the polycrystal, has been previously formed in the polycrystal and the heating is effected at a temperature lower than the temperature at which the discontinuous crystal grain growth of the polycrystal occurs, only the macrocrystal grain which has been previously formed as the nucleus can be greatly grown at a rapid speed.

Accordingly, the present invention consists in a method for producing a single crystal which comprises previously forming a macrocrystal grain as the nucleus of the discontinuous crystal grain growth in/on the polycrystal causing the discontinuous crystal grain growth and heating such a polycrystal at a temperature at which the discontinuous crystal grain growth of the polycrystal occurs to grow only the macrocrystal grain at a fairly high speed.

Accordingly, in the present invention, it is very important that the macrocrystal grain having substantially the same crystal structure as in the crystal grains composing the polycrystal and having the size from several times to several tens times of the size of the crystal grains composing the polycrystal, has been previously formed.

The formation of the macrocrystal grain in/on the polycrystal is carried out by the following processes.

(Note: When Figures are referred to, similar reference characters have been used throughout to designate like parts i.e. PX—Powder, MX—Macrocrystal, PCX—Polycrystalline material, MX'—the growing macrocrystal, SX—single crystal, AX—additive);

FIG. 2 shows a process whereby a small macrocrystal grain is embedded within a shaped non-sintered body and serves as a nucleus for single crystal grain growth.

FIG. 2, step a, shows the individual powder P2 and the macrocrystal M2. The macrocrystal M2 is embedded within the shaped body upon forming the powder into a specific shape by some forming means such as pressing. FIG. 2a is a cross-sectional view taken along the line I—I in FIG. 2, step b. FIG. 2a shows the appropriate location of the macrocrystal nucleus M2. The shaped body P2 with the macrocrystal nucleus M2 is subsequently sintered to form a polycrystalline body PC2 with a macrocrystal nucleus M2. The cross-section of the sintered body PC2, taken along the line II—II of FIG. 2, step d, is shown in FIGS. 2b and 2c. The sintered body is then heated up to a temperature slightly below the discontinuous temperature Td. The sintered polycrystalline material begins to form a single crystal M2' by utilizing the macrocrystal nucleus M2 and the polycrystalline material PC2, as shown in FIG. 2, step g. After subjecting the polycrystalline material to a temperature below Td, for a predetermined amount of time, the polycrystalline material forms a single crystal S2.

FIG. 3 displays another method of producing a single crystal from a polycrystalline material by introducing an additive on the surface of a polycrystal. Additives such as SiO$_2$, Nb$_2$O$_5$, SrO, BaO, Na$_2$O, PbO, B$_2$O$_3$ or mixtures or compounds would suffice. FIG. 3, step b, shows the additive A3 placed upon the surface of the polycrystal PC 3. The polycrystal is then heated thereby inducing a macrocrystal M3 as shown in FIG. 3, step b. The cross-sectional view of the polycrystal, as taken along the line III—III in FIG. 3, step c, is shown in FIGS. 3a and 3b. The polycrystalline body PC3 is heated up to and held at a temperature slightly below the discontinuous temperature Td, thus inducing single crystal grain growth M3' as shown in FIG. 3, step f.

After exposure to Td for a predetermined amount of time, FIG. 3, step g shows the resultant single crystal S3.

FIG. 4 also uses an additive to form a macrocrystal and thereby induce the growth of a single crystal from a polycrystalline material. However, the FIG. 4 process differs from the FIG. 3 process because the additive A4 is now embedded within a powder P4 and then sintered into a polycrystalline material PC4. The sintered polycrystalline material PC4 is similarly heated up to and held at a temperature slightly below the discontinuous temperature Td, thus inducing single crystal grain growth M4', as shown in FIG. 4, step g, until the polycrystalline material changes into the single crystal S4, as shown in FIG. 4, step h.

An alternative means of inducing a macrocrystal in polycrystalline material is shown in FIG. 5. The polycrystalline material PC5 is locally heated by some heating means 2, such as a laser, electron ray or like means, thus inducing a macrocrystal on the surface of the polycrystal. FIG. 5, step c, and FIGS. 5a and 5b, show the formed macrocrystal. The sintered polycrystalline material PC5 is similarly heated up to and held at a temperature slightly below the discontinuous temperature Td, thus inducing single crystal grain growth M5', as shown in FIG. 5, step f, with the final result of heating being a single crystal S5 as shown in FIG. 5, step g.

FIG. 6 illustrates another method of inducing a macrocrystal in a polycrystalline body. The cylindrical polycrystalline body PC6 in FIG. 6, step a, is machined so that one end of it has a conical shape, as shown in FIG. 6, step b. The tip of the cone is subsequently heated thus forming a macrocrystal nucleus M6. The sintered polycrystalline body PC6 is similarly heated up to and held at a temperature slightly below the discontinuous temperature Td, with the resulting product a single crystal S6.

In FIG. 7, a macrocrystal M7 is stress and heat induced upon the surface of the polycrystal PC7. FIG. 7, step b shows a weight W7 which is concurrently applied with heat resulting in a macrocrystal M7 shown in FIG. 7, step c, and FIG. 7a. The sintered polycrystalline body PC7 is similarly heated up to and held at a temperature slightly below the discontinuous temperature Td, with the resulting product a single crystal S7.

Also, a substance having substantially the same composition as the composition composing the polycrystal can be applied to at least one portion of the polycrystal surface by sputtering, vapor deposition, CVD or an equivalent process, to form an amorphous or microcrystal film. This film is locally heated with electron ray, infrared ray and the like or if necessary, an electron ray is in turn scanned on the film surface to form a macrocrystal from the local portion, or a stress is locally applied to said film portion to form a macrocrystal grain. In this case, a small piece of a seed single crystal may be contacted to the above described amorphous film or microcrystal film and heated to form the single crystal film having the same crystal orientation as the seed single crystal.

The processes for forming a macrocrystal grain in the polycrystal are not limited to the above described processes but may be other processes and in short, it is merely necessary to form in the polycrystal a macrocrystal grain having substantially the same crystal structure as the crystal grains composing the polycrystal.

The heating temperature for growing the single crystal by growing the macrocrystal grain used as the nucleus in the polycrystal direction is preferred to be a temperature as near as possible the temperature at which the discontinuous crystal grain growth of the polycrystal occurs, preferably a temperature which is within 100° C., particularly within 50° C. lower than the temperature causing the discontinuous crystal grain growth of the polycrystal.

The present invention is applicable to the production of single crystals of various oxides, such as ferrite, garnet, spinel, niobates, tantalates, titanates and the like, metals, carbides, nitrides and for example, the heating temperature for producing manganese zinc ferrite single crystal is preferred to be 1,250°–1,450° C. and the heating temperature for producing nickel zinc ferrite single crystal is preferred to be 1,250°–1,550° C. The heating temperature for producing garnet or spinel single crystal is desired to be 1,300°–1,450° C. and 1,700°–1,900° C. respectively but the average grain size, porosity of the formed polycrystals and the like vary depending upon the condition for producing each polycrystal, for example, the purity or composition, firing temperature, firing atmosphere of the starting materials and the like and the temperature causing the discontinuous crystal grain growth varies depending upon these effects, so that the heating temperature is selected within the above described temperature range depending upon the purity, composition, average grain size and porosity of the starting materials. Concerning niobates and tantalates, the same mention can be made and the heating temperature suitable for growing the single crystal may be confirmed by the heating test and the like.

As the heat process for growing the single crystal, use may be made of the following means. For example, the whole polycrystal is held at a constant temperature lower than the temperature causing the discontinuous crystal grain growth.

Since the temperature causing the discontinuous crystal grain growth of the polycrystal increases as the material is held at high temperature. When the material is held at high temperatures, the heating temperature is generally gradually raised at a temperature raising rate of about 5°–100° C./hr, preferably 10°–50° C./hr within a temperature lower than the temperature at which the discontinuous crystal grain growth is caused.

To prevent the crystal growth at the portions other than the boundary between the single crystal and the polycrystal, it is preferable to make the single crystal side to be higher temperature and the polycrystal side to be lower temperature, so that the higher temperature portion transfers in turn to the polycrystal side to convert the entire into single crystal.

In order to obtain the polycrystals showing the discontinuous crystal grain growth at high temperature as the polycrystal, for example, in the case of ferrite polycrystal and garnet polycrystal, iron oxide ($Fe_2O_3$) having a purity of higher than 99.9% obtained by roasting magnetite may be used. In the production of spinel polycrystal, alumina ($Al_2O_3$) having a purity of higher than 99.9% may be used. Concerning niobates and tantalates, niobium oxide and tantalum oxide having high purity may be similarly used.

The following examples are given for the purpose of illustration of the present invention and are not intended as limitations thereof.

EXAMPLE 1

A mixture having a composition of 50 mol % of $LiO_2$ and 50 mol % of $Nb_2O_5$ was prepared by using lithium oxide having a purity of 99.9% and niobium oxide having a purity of 99.9% as the starting materials. The process shown in FIG. 2 was utilized by forming the mixture into a shaped body of 15×15×15 mm with a 1 mm cube of $LiNbO_3$ single crystal embedded in substantially the center of the shaped body. Said shaped body was fired at 1,100° C. for 2 hours to obtain a polycrystal of $LiNbO_3$ including a macrocrystal grain.

This polycrystal had an average grain size of 5 μm and a porosity of 0.02%. As a result of the heating test, the temperature causing the discontinuous crystal grain growth was 1,210° C. The surface portion of the polycrystal was removed to prepare a block of 10×10×10 mm and this block was heated at 1,150° C. in air and then the temperature was raised from 1,150° C. to 1,205° C. at a temperature raising rate of 10° C./hr and then the block was cooled to obtain 10×10×10 mm of $LiNbO_3$ single crystal.

EXAMPLE 2

A ferrite mixture having a composition of 18.1 mol % of NiO, 32.3 mol % of ZnO and 49.6 mol % of $Fe_2O_3$ was prepared by using nickel oxide having a purity of 99.9% zinc oxide having a purity of 99.9% and ferric oxide having a purity of 99.9% and prepared by roasting magnetite and the mixture was formed into a shaped body of 10×10×10 mm. To the shaped body surface were applied fine grains of $SiO_2$ having a diameter of about 10 μm as an additive for promoting the crystal growth, in accordance with the process shown in FIG. 3, and the shaped body was fired at 1,300° C. for 2 hours in an oxygen atmosphere to obtain nickel zince ferrite polycrystal.

In this ferrite polycrystal, a macrocrystal grain having a diameter of about 300 μm has been formed at the portion where fine grains of $SiO_2$ have been applied and the crystal grain size at the other portions was about 6 μm.

In order to confirm the temperature causing the discontinuous crystal grain growth of the polycrystal, a heating test of the polycrystal portion containing no macrocrystal grain was made and the relation of the heating temperature to the crystal grain size was examined. When one hour was held at 1,380° C., the crystal grain size was 8 μm, in the case of 1,400° C., the size was 10 μm, in the case of 1,420° C., the size was 15 μm and in the case of 1,430° C., some macrocrystal grains having about 100–300 μm were observed among crystal grains having an average crystal grain size of 16 μm and at 1,460° C., the whole polycrystal was composed of macrocrystal grains having a grain size of 0.5–2 mm and the temperature causing the discontinuous crystal grain growth was 1,430° C.

This ferrite polycrystal was heated to 1,380° C. in oxygen atmosphere at a temperature raising rate of 300° C./hr and then the temperature was raised to 1,430° C. at a rate of 30° C./hr and the cooled to obtain 8×8×8 mm of nickel zinc ferrite single crystal.

EXAMPLE 3

A mixture having a composition of 31 mol % of MnO, 16.5 mol % of ZnO and 52.5 mol % of $Fe_2O_3$ and containing less than 0.01% of $SiO_2$ less than 0.05% of $TiO_2$, less than 0.005% of CaO less than 0.03% of $Na_2O$ as impurities was prepared by using manganese oxide having a purity of 99.9% which was obtained by roasting manganese carbonate, zinc oxide having a purity of 99.9% and ferric oxide obtained by roasting magnetite as the starting materials and the mixture was formed into a shaped body and said shaped body was roasted at 1,320° C. for 4 hours under equilibrium oxygen partial pressure to obtain manganese zince ferrite polycrystal.

This ferrite polycrystal had an average grain size of about 7 μm and a porosity of about 0.01%. In order to confirm the temperature causing the discontinuous crystal grain growth of the ferrite polycrystal, a heating test was effected and the variation of the crystal grains composing the polycrystal with respect to the heating temperature was determined and when a temperature of 1,350° C. was held for one hour, the grain size was 8 μm, at 1,370° C. the grain size was 9 μm, at 1,380° C. some macrocrystal grains having a grain size of 50-200 μm were observed among the crystal grains having an average crystal grain size of 9 μm and at 1,390° C., the whole polycrystal was composed of macrocrystal grains of 3-5 mm and the temperature causing the discontinuous crystal grain growth was 1,380° C. 5×5×5 mm of block was cut-off from this manganese zinc ferrite polycrystal and this block was locally heated in nitrogen atmosphere by using laser beam at a focus temperature of 1,400° C. to form a macrocrystal grain having a grain size of about 200 μm in accordance with the process shown in FIG. 5. This block was heated from 1,150° C. to 1,350° C. at a temperature raising rate of 300° C./hr under nitrogen atmosphere having an oxygen concentration of 5 vol % and the temperature was raised from said temperature to 1,420° C. at a temperature raising rate of 30° C./hr and the cooled to obtain 5×5×5 mm of manganese zinc ferrite single crystal.

EXAMPLE 4

A ferrite mixture having a composition of 31 mol % of MnO, 16.5 mol % of ZnO and 52.5 mol % of Fe₂O₃ and containing less than 0.01% of SiO₂, less than 0.05% of TiO₂, less than 0.005% of CaO and less than 0.03% of Na₂O as impurities was prepared by using manganese oxide having a purity of 99.9%, which was obtained by roasting manganese carbonate, zinc oxide having a purity of 99.9% and ferric oxide obtained by roasting magnetite as the starting materials and the mixture was shaped and the shaped body was fired at 1,320° C. for 4 hours under equilibrium oxygen partial pressure to obtain manganese zinc ferrite polycrystal.

This ferrite polycrystal had an average grain size of about 10 μm and a porosity of about 0.01% and the temperature causing the discontinuous crystal grain growth was 1,380° C. From this ferrite polycrystal was cut-off a circular rod of 50×20 mm and one end of said rod was formed into a conical shape having an angle of 60° and then said rod was heated from 1,150° C. to 1,350° C. at a temperature raising rate of 300° C./hr under nitrogen atmosphere having an oxygen concentration of 5 vol % and the temperature was raised to 1,420° C. at a temperature raising rate of 30° C./hr to obtain 50×20 mm of manganese zinc ferrite single crystal in accordance with the process shown in FIG. 6.

EXAMPLE 5

A mixture having a composition of 37.5 mol % of Y₂O₃ and 62.5 mol % of Fe₂O₃ and containing less than 0.01% of SiO₂, less than 0.005% of CaO and less than 0.0003% of Na₂O was prepared by using yttrium oxide having a purity of 99.9% and ferric oxide having a purity of 99.9% as the starting materials and the mixture was shaped and fired at 1,370° C. for 6 hours to obtain yttrium iron garnet polycrystal. This polycrystal had an average grain size of about 15 μm and a pososity of 0.05% and the temperature causing the discontinuous crystal grain growth was 1,420° C. From this yttrium iron garnet polycrystal was cut-off a circular rod of 50×20 mm and one end of the rod was formed into a conical shape having an angle of about 60°. Then, this rod was heated from 1,200° C. to 1,370° C. at a temperature raising rate of 300° C./hr and then the temperature was further raised to 1,450° C. at a temperature raising rate of 30° C./hr and then the heated rod was cooled to obtain 50×20 mm of yttrium iron garnet single crystal, in accordance with the process shown in FIG. 6.

EXAMPLE 6

A mixture having a composition of 50 mol % of MgO and 50 mol % of Al₂O₃ was prepared by using magnesium oxide having a purity of 99.9% and aluminum oxide having a purity of 99.9% and containing less than 0.005% of SiO₂, 0.005% of TiO₂ and less than 0.003% of CaO as impurities as the starting materials and shaped and fired at 1,700° C. for 5 hours in hydrogen atmosphere to obtain spinel polycrystal. This spinel polycrystal had an average grain size of about 7 μm and a porosity of 0.2% and the temperature causing the discontinuous crystal grain growth was 1,800° C.

From this spinel polycrystal was cut-off a circular rod of 50×20 mm and one end of said rod was formed into a conical shape having an angle of 60° and then the rod was heated to 1,700° C. at a temperature raising rate of 300° C./hr in hydrogen atmosphere and the temperature was raised to 1,850° C. at a temperature raising rate of 30° C./hr and then the heated rod was cooled to obtain 50×20 mm of spinel single crystal, in accordance with the process shown in FIG. 6.

EXAMPLE 7

A mixture having a composition of 31 mol % of MnO, 16.5 mol % of ZnO and 52.5 mol % of Fe₂O₃ and containing less than 0.01% of SiO₂, less than 0.05% of TiO₂, less than 0.005% of CaO and less than 0.03% of Na₂O as impurities was prepared by using manganese oxide having a purity of 99.9% and obtained by roasting manganese carbonate, zinc oxide having a purity of 99.9% and ferric oxide having a purity of 99.9% and obtained by roasting magnetite and the mixture was shaped and fired at 1,320° C. for 4 hours under equilibrium oxygen partial pressure to obtain manganese zince ferrite polycrystal.

The ferrite polycrystal had an average grain size of 10 μm and a porosity of 0.01% and the temperature causing the discontinuous crystal grain growth was 1,380° C. From this manganese zinc ferrite polycrystal was cut-off a block of 10×10×5 mm and on one side surface of said block was formed manganese zinc ferrite amorphous film through high frequency sputtering and one end of the amorphous film was locally heated at 1,000° C. by laser beam to cause crystallization by utilizing a process similar to that depicted in FIG. 5, and then the laser beam was scanned in turn toward the outer circumference concentrically by making the crystallized portion center to obtain a single crystal film. This junctioned body of the single crystal and the polycrystal was heated from 1,150° C. to 1,350° C. at a temperature raising rate of 300° C./hr in nitrogen atmosphere of an oxygen concentration of 5 vol % and the temperature was raised to 1,420° C. at a temperature raising rate of 30° C./hr and cooled to obtain 10×10×5 mm of manganese zinc ferrite single crystal.

EXAMPLE 8

A mixture having a composition of 31 mol % of MnO, 16.5 mol % of ZnO and 52.5 mol % of $Fe_2O_3$ and containing less than 0.01% of $SiO_2$, less than 0.05% of $TiO_2$, less than 0.005% of CaO and less than 0.03% of $Na_2O$ as impurities was prepared by using manganese oxide having a purity of 99.9% and obtained by roasting manganese carbonate, zinc oxide having a purity of 99.9% and ferric oxide obtained by roasting magnetite as the starting materials and the mixture was shaped and fired at 1,250° C. for 6 hours under equilibrium oxygen partial pressure to obtain manganese zinc ferrite polycrystal.

This ferrite polycrystal had an average grain size about 3 μm and a porosity of about 0.01% and the temperature causing the discontinuous crystal grain growth was 1,350° C. From this ferrite polycrystal was cut-off a block of 50×50×5 mm and one side surface of said block was polished into a mirror surface and on said surface was formed 1 μm of manganese zinc ferrite amorphous film through high frequency sputtering and on the film was mounted a single crystal of 3×3×1 mm produced by high pressure Bridgman process. This was heated at 900° C. in nitrogen atmosphere to convert the amorphous film into a single crystal along the crystal orientation of the single crystal. Then, the junctioned body of the single crystal and the polycrystal was heated from 1,150° C. to 1,320° C. at a temperature raising rate of 300° C./hr in nitrogen atmosphere of an oxygen concentration of 5 vol % and the temperature was raised to 1,370° C. at a temperature raising rate of 30° C./hr and then cooled to obtain manganese zinc ferrite single crystal of 50×50×5 mm.

EXAMPLE 9

A mixture having a composition of 37.5 mol % of $Y_2O_3$ and 62.5 mol % of $Fe_2O_3$ and containing less than 0.01% of $SiO_2$, less than 0.005% of CaO and less than 0.003% of $Na_2O$ as impurities was prepared by using yttrium oxide having a purity of 99.99% and ferric oxide having a purity of 99.9% and obtained by roasting magnetite as the starting materials and the mixture was shaped and fired at 1,370° C. for 6 hours to obtain yttrium iron garnet polycrystal.

This polycrystal having an average grain size of about 15 μm, a porosity of 0.05% and the temperature causing the discontinuous crystal grain growth was 1,420° C. From this yttrium iron garnet polycrystal was cut-off a block of 10×10×5 mm and on the block surface was formed 5 m of yttrium iron garnet microcrystal film by CVD process and infrared ray from halogen lamp was collected by a concave reflection mirror in air and focussed on one end of the film to locally heat the film at a focus temperature of 1,000° C. and then the whole film was heated at 900° C. to obtain a single crystal film.

This junctioned body of the single crystal film and the polycrystal was heated from 1,200° C. to 1,370° C. at a temperature raising rate of 300° C./hr in air and this temperature was further raised to 1,450° C. at a temperature raising rate of 30° C./hr and cooled to obtain 10×10×5 mm of yttrium iron garnet single crystal.

EXAMPLE 10

A mixture having a composition of 50 mol % of MgO and 50 mol % of $Al_2O_3$ was prepared by using magnesium oxide having a purity of 99.9% and aluminum oxide having a purity of 99.9% and containing less than 0.005% of $SiO_2$, less than 0.005% of $TiO_2$ and less than 0.003% of CaO as impurities as the starting materials. The mixture was shaped and fired at 1,700° C. for 5 hours in hydrogen atmosphere to obtain spinel polycrystal. This spinel polycrystal had an average grain size of about 7 μm and a porosity of 0.2% and the temperature causing the discontinuous crystal grain growth was 1,800° C.

This spinel polycrystal was cut-off into block of 5×5×2 mm and on the surface was formed a spinel amorphous film of 5 μm at an oxygen partial pressure of $1\times10^{-4}$ torr polycrystal temperature of 500° C. through high frequency sputtering and a part of the amorphous film was locally heated at 1,600° C. by laser beam to cause crystallization and then the whole amorphous film was heated at 1,500° C. to obtain the single crystal film. This junctioned body of the single crystal film and the polycrystal was heated to 1,700° C. in hydrogen atmosphere at a temperature raising rate of 300° C./hr and the temperature was further raised to 1,850° C. at a temperature raising rate of 30° C./hr and cooled to obtain 5×5×2 mm of spinel single crystal.

As mentioned above, the method for producing a single crystal according to the present invention comprises forming a macrocrystal grain, which becomes nucleus for growing a single crystal in/on a polycrystal showing discontinuous crystal grain growth and heating the polycrystal at a temperature lower than the temperature causing the discontinuous crystal grain growth to grow the macrocrystal grain from which a single crystal grows. The production of the present invention can be effected at a lower temperature than the method for producing a single crystal from the conventional liquid phase, so that the unbalance of the composition due to the problem of evaporation does not occur and an apparatus for producing a single crystal which is a large size, complicated and expensive, is not necessary. The single crystal can be commercially and cheaply produced by a very simple process, such as a conventional sintering process. The present invention can be applied to production of ceramics and metal single crystal and is a commercially very useful process for producing single crystals.

What is claimed is:

1. A method for producing a single crystal, comprising:
    forming a polycrystal which has a macrocrystal grain therein or thereon, said polycrystal having the property of a discontinuous crystal grain growth which noticeably increases the crystal growing rate at a given temperature in the course of heating, said macrocrystal grain having substantially the same crystal structure as crystal grains comprising said polycrystal;
    heating said polycrystal having said macrocrystal grain to a temperature lower than the temperature causing discontinuous crystal grain growth of the polycrystal, said heating causing growth of said macrocrystal grain; and during said heating, integrating said macrocrystal grain with the crystal grains of said polycrystal so that a single crystal is grown.

2. The method as claimed in claim 1, wherein a polycrystal having a macrocrystal grain is prepared by applying an additive which promotes crystal growth on a surface of a polycrystal and heating the polycrystal.

3. The method as claimed in claim 1, wherein a polycrystal having a macrocrystal grain is prepared by embedding an additive which promotes crystal growth in powder when shaping the powder into a shaped body.

4. The method as claimed in claim 1, wherein a polycrystal having a macrocrystal grain is prepared by applying an additive which promotes crystal growth on the surface of a shaped body, and then heating the resulting mass.

5. The method as claimed in claim 1, wherein a process for forming a macrocrystal grain in contact with crystal grains composing the polycrystal comprises concurrently and integrally sintering a macrocrystal grain together with a shaped body when preparing the polycrystal.

6. The method as claimed in claim 1, wherein a process for forming a macrocrystal grain in contact with crystal grains composing the polycrystal comprises heating locally the polycrystal at a temperature higher than the temperature causing the discontinuous crystal grain growth.

7. A method as claimed in claim 1, wherein a process for forming a macrocrystal grain in contact with crystal grains composing the polycrystal comprises forming a projected portion in the polycrystal and heating said polycrystal having a projected portion.

8. The method as claimed in claim 1, wherein a process for forming a macrocrystal grain in contact with crystal grains composing the polycrystal comprises heating the polycrystal, concurrently locally apply a stress to the polycrystal.

* * * * *